(12) United States Patent
Gris

(10) Patent No.: US 6,180,442 B1
(45) Date of Patent: Jan. 30, 2001

(54) BIPOLAR TRANSISTOR WITH AN INHOMOGENEOUS EMITTER IN A BICMOS INTEGRATED CIRCUIT METHOD

(75) Inventor: Yvon Gris, Tullins (FR)

(73) Assignee: SGS-Thomson Microelectronics S.A., Gentilly (FR)

(*) Notice: Under 35 U.S.C. 154(b), the term of this patent shall be extended for 0 days.

(21) Appl. No.: 08/970,246

(22) Filed: Nov. 13, 1997

(30) Foreign Application Priority Data

Nov. 19, 1996 (FR) .................................... 96 14409

(51) Int. Cl.[7] .............................................. H01L 21/8238
(52) U.S. Cl. ......................... 438/202; 438/309; 438/344; 438/345; 438/349; 438/350; 438/365; 438/367; 438/368; 438/370; 438/375; 438/377; 438/378; 438/482; 438/491; 438/525; 438/530; 438/532; 438/545; 438/548; 438/558; 438/559; 438/564
(58) Field of Search .................................. 438/309, 202, 438/344, 345, 349, 350, 364, 365, 366, 367, 368, 369, 370, 375, 377, 378, 482, 491, 525, 530, 532, 545, 548, 558, 559, 564, FOR 160, FOR 165, FOR 309, FOR 312, FOR 322; 148/DIG. 10, DIG. 11, DIG. 123, DIG. 124, DIG. 151

(56) References Cited

U.S. PATENT DOCUMENTS

| | | | |
|---|---|---|---|
| 4,215,418 | 7/1980 | Muramatsu | 364/757 |
| 4,276,543 | 6/1981 | Miller et al. | 340/347 AD |
| 4,338,138 | * 7/1982 | Cavaliere et al. | 148/1.5 |
| 4,339,767 | 7/1982 | Horung et al. | 357/44 |
| 4,752,589 | 6/1988 | Schaber | 437/31 |
| 4,799,098 | 1/1989 | Ikeda et al. | 357/43 |

(List continued on next page.)

FOREIGN PATENT DOCUMENTS

| | | |
|---|---|---|
| 0 495 329 A2 | 7/1992 | (EP) . |
| 0 581 475 A1 | 2/1994 | (EP) . |
| 0 606 001 | 7/1994 | (EP) . |
| 0 746 032 A2 | 12/1996 | (EP) . |
| 361283167 | * 12/1986 | (JP) .............................. 438/FOR 165 |

(List continued on next page.)

OTHER PUBLICATIONS

Patent Abstracts of Japan, vol. 015, No. 114 (E–1047) & JP–A–03 004538 (Toshiba Corp.), Jan. 10, 1991.
Patent Abstracts of Japan, vol. 018, No. 171 (E–1529) & JP–A–05 343613 (Yamaha Corp.), Dec. 24, 1993.
Patent Abstracts of Japan, vol. 95, No. 1 & JP–A–06 291262 (Sony Corp.), Oct. 18, 1994.
IBM Technical Disclosure Bulletin, "Simplified Bipolar in Bo–CMOS," vol. 33, No. 7, Dec. 1990, pp. 401–402, New York, US.
Scharf, B., "BICMOS Process Design For Mixed–Signal Applications," Proceedings Of The International Symposium on Circuits and Systems, San Diego, May 10–13, 1992, vol. 6, pp. 2683–2686, Institute of Electrical and Electronics Engineers.

(List continued on next page.)

Primary Examiner—Long Pham
(74) Attorney, Agent, or Firm—Wolf, Greenfield & Sacks, P.; James H. Morris; Theodore E. Galanthay (57) ABSTRACT

The present invention relates to a method for fabricating an integrated circuit including an NPN-type bipolar transistor, including the steps of defining a base-emitter location of the transistor with polysilicon spacers resting on a silicon nitride layer; overetching the silicon nitride under the spacers; filling the overetched layer with highly-doped N-type polysilicon; depositing an N-type doped polysilicon layer; and diffusing the doping contained in the third and fourth layers to form the emitter of the bipolar transistor.

38 Claims, 7 Drawing Sheets

U.S. PATENT DOCUMENTS

| | | |
|---|---|---|
| 4,829,015 | 5/1989 | Schaber et al. .......... 437/31 |
| 4,931,407 | 6/1990 | Maeda et al. .......... 437/45 |
| 4,957,874 | 9/1990 | Soejima .......... 437/31 |
| 4,958,213 | 9/1990 | Eklund et al. .......... 357/59 |
| 4,960,726 | 10/1990 | Lechaton et al. .......... 437/59 |
| 4,965,217 | 10/1990 | Desilets et al. .......... 438/52 |
| 4,975,381 * | 12/1990 | Taka et al. .......... 437/31 |
| 4,980,302 | 12/1990 | Shimizu .......... 437/31 |
| 5,008,207 | 4/1991 | Blouse et al. .......... 437/31 |
| 5,015,594 | 5/1991 | Chu et al. .......... 437/31 |
| 5,045,484 | 9/1991 | Yamada et al. .......... 437/31 |
| 5,047,357 | 9/1991 | Ecklund .......... 437/31 |
| 5,061,645 | 10/1991 | Nakazato et al. .......... 437/31 |
| 5,089,429 | 2/1992 | Hsu .......... 437/31 |
| 5,100,815 | 3/1992 | Tsubone et al. .......... 437/34 |
| 5,128,271 | 7/1992 | Bronner et al. .......... 437/31 |
| 5,137,840 | 8/1992 | Desilets et al. .......... 437/32 |
| 5,171,702 | 12/1992 | Prengle et al. .......... 437/59 |
| 5,192,992 | 3/1993 | Kim et al. .......... 257/370 |
| 5,238,850 | 8/1993 | Matsunaga et al. .......... 437/40 |
| 5,286,667 | 2/1994 | Lin et al. .......... 437/52 |
| 5,302,535 * | 4/1994 | Imai et al. .......... 437/31 |
| 5,321,650 | 6/1994 | Kikuchi et al. .......... 365/177 |
| 5,354,699 | 10/1994 | Ikeda et al. .......... 437/34 |
| 5,395,782 | 3/1995 | Ohkoda et al. .......... 437/47 |
| 5,403,758 | 4/1995 | Yoshihara .......... 437/31 |
| 5,416,031 | 5/1995 | Miwa .......... 437/31 |
| 5,429,959 | 7/1995 | Smayling .......... 437/34 |
| 5,439,832 * | 8/1995 | Nakamura .......... 437/31 |
| 5,457,062 | 10/1995 | Keller et al. .......... 437/47 |
| 5,471,083 | 11/1995 | Ikeda et al. .......... 257/370 |
| 5,471,085 | 11/1995 | Ishigaki et al. .......... 257/370 |
| 5,478,760 | 12/1995 | Yang .......... 437/31 |
| 5,488,003 | 1/1996 | Chambers et al. .......... 437/31 |
| 5,489,547 | 2/1996 | Erdeljac et al. .......... 438/60 |
| 5,494,836 * | 2/1996 | Imai .......... 437/31 |
| 5,504,018 * | 4/1996 | Sato .......... 437/31 |
| 5,523,245 * | 6/1996 | Imai .......... 437/31 |
| 5,541,124 * | 7/1996 | Miwa et al. .......... 437/31 |
| 5,547,893 | 8/1996 | Sung .......... 437/52 |
| 5,563,762 | 10/1996 | Leung et al. .......... 361/301.4 |
| 5,599,723 * | 2/1997 | Sato .......... 437/31 |
| 5,633,181 | 5/1997 | Hayashi .......... 438/234 |
| 5,643,806 * | 7/1997 | Miwa et al. .......... 437/31 |
| 5,648,279 | 7/1997 | Imai .......... 437/31 |
| 5,665,615 | 9/1997 | Anmo .......... 438/202 |
| 5,705,410 | 1/1998 | Guegan .......... 437/35 |
| 5,719,082 * | 2/1998 | Violette .......... 438/309 |
| 5,726,069 * | 3/1998 | Chen et al. .......... 437/31 |
| 5,753,957 | 5/1998 | Watabe .......... 257/378 |
| 5,766,999 * | 6/1998 | Sato .......... 438/309 |
| 5,773,349 | 6/1998 | Ham .......... 438/348 |
| 5,880,000 | 3/1999 | Gris .......... 438/309 |
| 5,953,600 | 9/1999 | Gris .......... 438/200 |
| 5,970,333 | 10/1999 | Gris .......... 438/207 |

FOREIGN PATENT DOCUMENTS

| | | | |
|---|---|---|---|
| 361290761 * | 12/1986 | (JP) | .......... 438/FOR 165 |
| 361290762 * | 12/1986 | (JP) | .......... 438/FOR 165 |
| 361290763 * | 12/1986 | (JP) | .......... 438/FOR 165 |
| 404250631 * | 9/1992 | (JP) | .......... 438/FOR 165 |
| WO 98/05071 | 2/1998 | (WO) . | |

OTHER PUBLICATIONS

French Search Report from French Patent Application 96 14409, filed Nov. 19, 1996.

Proceedings Of The Bipolar/BiCMOS Circuits and Technology Meeting, Minneapolis, Oct. 7–8, 1992. Institute of Electrical and Electronics Engineers, pp. 96–99, Hayden, J.D., et al. "An Ultra–Shallow Link Base For A Double Polysilicon Bipolar Transistor".

* cited by examiner

BIPOLAR TRANSISTOR WITH AN INHOMOGENEOUS EMITTER IN A BICMOS INTEGRATED CIRCUIT METHOD

BACKGROUND OF THE INVENTION

1. Field of the Invention

The present invention relates to a line of fabrication of integrated circuits containing, in particular, bipolar and complementary MOS (CMOS) components. This type of line is generally called a BICMOS line.

SUMMARY OF THE INVENTION

The present invention can provide a line in which the dimensions of an element designed on a mask can be of a dimension lower than or equal to 0.4 $\mu$m, for example, from 0.2 to 0.35 $\mu$m.

More specifically, the present invention provides a line in which the properties of NPN-type bipolar transistors are optimized.

The present invention provides a method for fabricating a bipolar transistor of NPN type, including the steps of forming an N-type epitaxial layer on a P-type substrate, a buried layer being provided at least at the location of the bipolar transistor; forming a thick oxide layer open at the base-emitter location of the bipolar transistor; forming a first P-type doped polysilicon or amorphous silicon layer and a second encapsulation oxide layer; opening these last two layers at the center of the base-emitter region of the bipolar transistor; diffusing the doping contained in the first silicon layer in the underlying epitaxial layer, to form the extrinsic base of the bipolar transistor, during which step a thin oxide layer forms on the apparent silicon surfaces; depositing a first layer of silicon nitride, depositing a second layer of polysilicon, and anisotropically etching the second polysilicon layer to leave in place spacers in the vertical portions thereof; removing the apparent silicon nitride and overetching it under the spacers; removing the thin oxide layer at the locations where the apparent silicon nitride has been overetched; implanting an N-type collector doping; implanting a P-type doping to form the intrinsic base of the bipolar transistor; depositing a third highly-doped N-type polysilicon layer so that it penetrates into the overetched area under the spacers and etching it anisotropically to leave it in place in this overetched area; and depositing a fourth N-type doped polysilicon layer and diffusing the doping contained in the third and fourth layers to form the emitter of the bipolar transistor.

According to an embodiment of the present invention, the first silicon nitride layer has a thickness of around 50 nm.

According to an embodiment of the present invention, the spacers have a base length of around 200 nm and the overetching of the silicon nitride layer is performed across a width of around 100 nm.

According to an embodiment of the present invention, the third polysilicon layer is doped to about $10^{20}$at./cm$^3$ and is from 10 to 100 times as doped as the fourth polysilicon layer.

According to an embodiment of the present invention, this method includes the step of depositing a second silicon nitride layer between the first P-type doped polysilicon or amorphous silicon layer and the second encapsulation oxide layer.

These and other features and advantages of the present invention, will be discussed in detail in the following non-limiting description of specific embodiments of the present invention, in relation with the accompanying drawings.

DETAILED DESCRIPTION

As usual in the field of the representation of semiconductor components, the various cross-sectional views are not drawn to scale. The lateral and crosswise dimensions of the various layers and regions are arbitrarily enlarged or reduced to facilitate the drawings.

Generally in the following description, the left side of FIGS. 1 to 11 in which is formed a CMOS component will be designated as the CMOS side and the right side of these drawings in which is formed an NPN-type bipolar transistor will be designated as the bipolar side. In the following, the fabrication of an N-channel MOS transistor, of a P-channel MOS transistor and of an NPN-type bipolar transistor is described. Of course, in a practical implementation, many identical components will be simultaneously formed, as well as possibly other types of elementary components.

According to an aspect of the present invention, the initial steps correspond to known steps of fabrication of CMOS integrated circuits of very small dimensions (minimum dimension, or gate dimension, under 0.35 $\mu$m).

Figure 1:
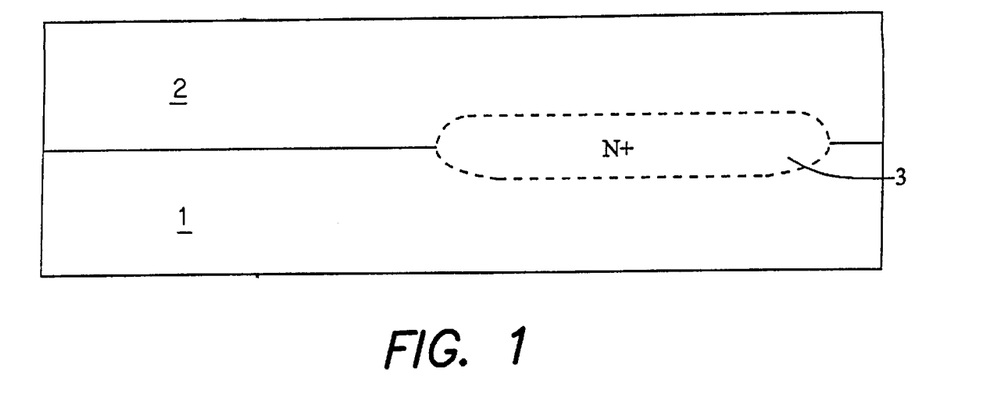
FIGS. 1 to 11 are simplified cross-sectional views illustrating successive steps of fabrication of an embodiment of an N-channel MOS transistor, of a P-channel MOS transistor, and of an NPN-type bipolar transistor.

As shown in FIG. 1, an N-type epitaxial layer 2 is formed on an initial P-type substrate 1. The epitaxial layer is relatively thin, for example, of a thickness of about 1 to 1.2 $\mu$m.

Before the growth of the epitaxial layer, if desired, buried layers of appropriate types are provided An the areas where N or P wells of CMOS transistors are to be formed and a buried layer 3 of type N is formed on the bipolar side.

Figure 2:
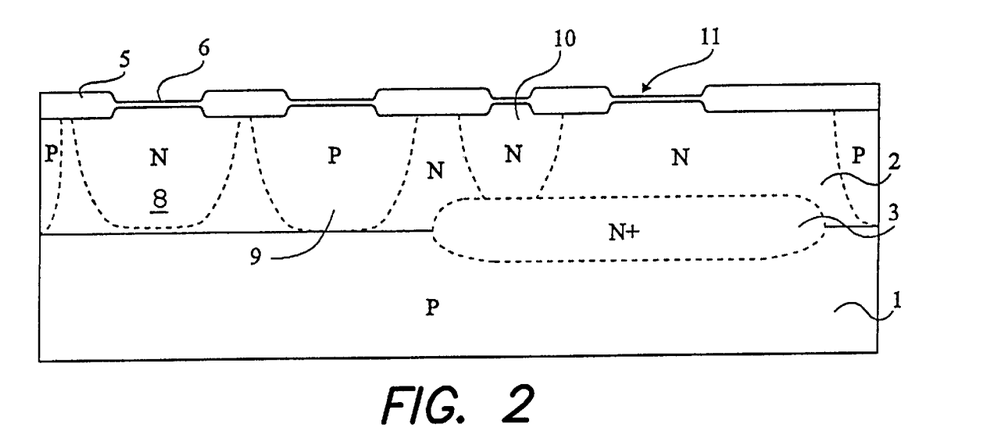

As shown in FIG. 2, on the MOS side, the regions of the MOS transistors are limited by openings in a thick oxide layer 5 formed by any known technique. Through the thick oxide or a thin oxide region 6 formed in the openings, N-type wells 8 and P-type wells 9 are conventionally implanted. These wells are for example formed by a succession of three implants, one of which runs through thick oxide 5 in unmasked regions. These N and P wells are respectively meant for P-channel MOS transistors and N-channel MOS transistors. The surface doping level (some $10^{16}$at./cm$^3$) determines the threshold voltage of the transistors. In the general case, the P wells (associated with a P$^+$ buried layer) are in electrical contact with the P substrate. It could be, however, provided to form at least some of the P wells on an N-type buried layer. The N wells are completely insulated since they emerge in the P substrate and they are laterally insulated by P regions formed like the P wells.

Simultaneously, on the bipolar side, a region in which a drive-in for recovering the collector contact or collector well 10 joining buried layer 3 will be formed is delimited in thick oxide 5. This collector well is formed by at least some of the implants performed to form N-type well 8, or by a specific N$^+$-type implant. This collector well can also be formed subsequently at the same time as the sources and drains of the N-channel MOS transistors. Also, an area 11 in which the base and the emitter of an NPN-type bipolar transistor will be formed is delimited in the thick oxide. During the various implants of N and P wells, this area 11 is masked.

Figure 3:
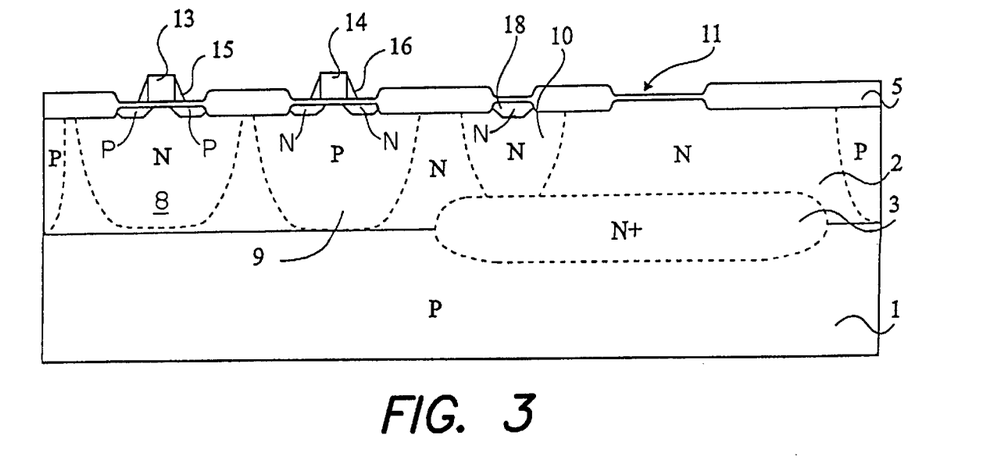

As shown in FIG. 3, on the MOS side, insulated gates 13 and 14 of the MOS transistors are conventionally formed; first implants are performed (LDD); spacers 15 and 16 are formed; and drain and source implants are performed. In well 8, the implants are of type P and, in well 9, the implants are of type N. Concurrently to the making of the source and drain implants of the N-channel transistors in the P wells, a highly-doped N-type diffusion 18 is performed at the surface of collector well 10 to improve the subsequent contact making.

Then, a fast thermal annealing is performed (1025° C.).

After this step, at the end of which most of the MOS transistors has been made (except for the possible contact making silicidations and the metallizations), the NPN-type bipolar transistor is made.

Figure 4:
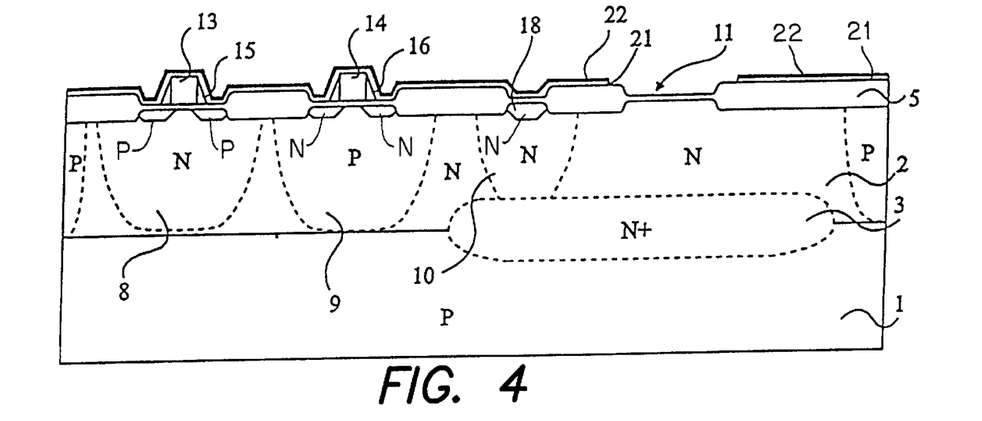

At the step illustrated in FIG. 4, a double protection layer including a silicon oxide layer 21 having, for example, a width of about 20 nm followed by a silicon nitride layer 22 having, for example, a thickness of about 30 nm is deposited over the entire structure, by chemical vapor deposition. This layer 21–22 is opened in the area 11 where it is desired to form the emitter-base region of a bipolar transistor. It should be noted that the positioning of this opening is not critical since it stops on thick oxide regions.

Figure 5:
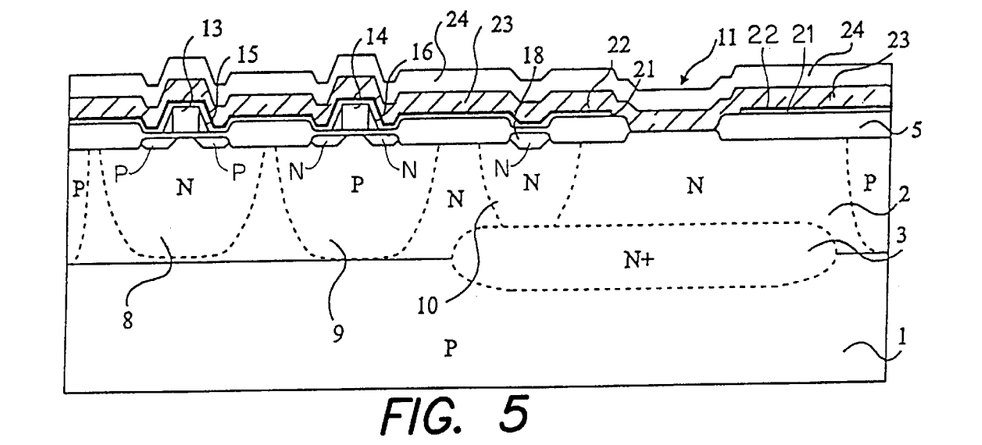

At the step illustrated in FIG. 5, a silicon layer 23 having, for example, a width of around 200 nm followed by an encapsulation oxide 24 having, for example, a thickness of about 300 nm are deposited over the entire structure.

Silicon layer 23 must be P-type doped since it will be used, as it will be seen hereafter, as a doping source for the extrinsic base of the NPN transistor and will be called the base polysilicon. Although it is referred to as the base polysilicon, it could also be any type of deposited silicon layer, for example, amorphous silicon. Preferably, according to an aspect of the present invention, an undoped polysilicon or amorphous silicon layer 23 is first deposited, after which a P-type doping is implanted in this layer. Preferably, boron is implanted in the form of very high dose low energy $BF_2$ ($10^{15}$ to $10^{16}$at./cm$^2$) so that the implanted boron concentrates in the upper part of the layer, avoiding implantation of boron in the underlying silicon substrate in region 11.

Figure 6:
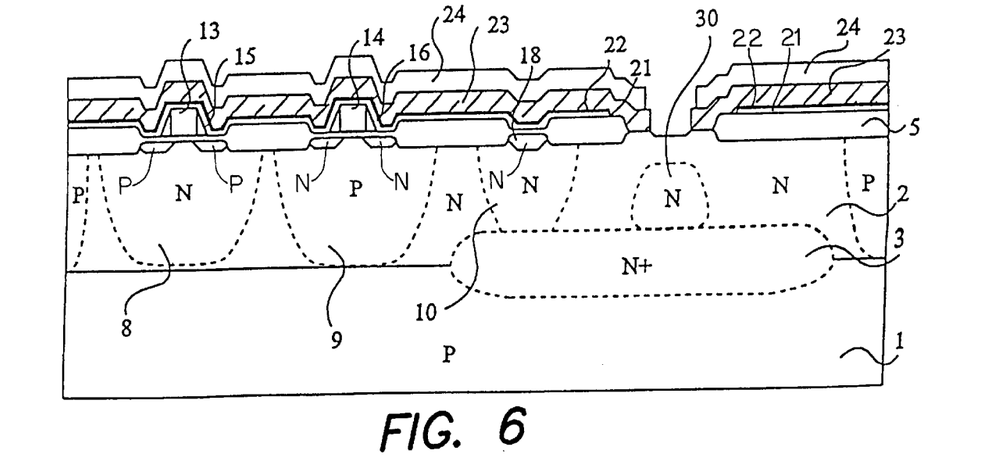

At the step illustrated in FIG. 6, an opening is provided in layers 24 and 23 in the central portion of region 11. This opening has for example a width included between 0.4 and 0.8 µm and penetrates into the monosilicon by less than 50 nm. Then, an N-type implant is performed to define the collector 30 of the NPN transistor. The collector is thus self-aligned on the opening. The N implant is performed at medium dose and high energy (for example, $10^{12}$ to $10^{14}$at./cm$^2$ under 500 keV). Thus, an effective collector region of limited lateral extent, substantially equal to that of the intrinsic base which is formed afterwards, is obtained. This contributes to obtaining an NPN transistor having low stray capacitance between the collector and the extrinsic base. The implant is optimized (for example, by successive implants) so that the contour of the collector provides the best possible compromise between, on the one hand, the collector resistance and the time of transit through this collector and, on the other hand, obtaining high enough emitter-collector and base-collector breakdown voltages (typically 4 volts) and a low base-collector capacitance. It should also be noted that this collector implant enables to previously choose an epitaxial layer 2 having a doping and a thickness proper for optimizing the CMOS transistors and then independently optimizing the characteristics of the NPN transistors. Especially, this epitaxial layer can be thicker than if it had to be directly used as a collector layer of the NPN transistor.

Figure 7:
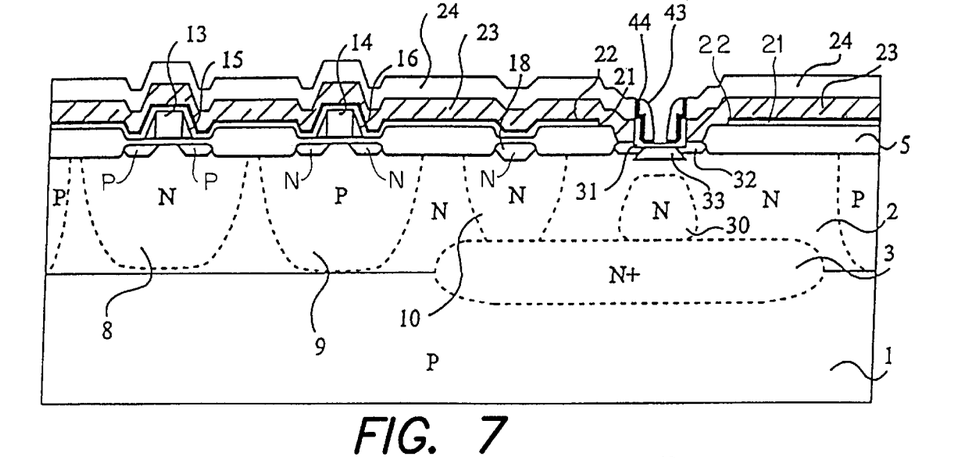

As shown in FIG. 7, after removing the masking resist, a thermal oxidation is performed, during which a thin thermal oxide layer 31 of a thickness of around 5 to 10 nm forms and during which the boron contained in polysilicon layer 23 starts diffusing in the underlying epitaxial layer to form an extrinsic base region 32 having, for example, a junction depth of around 100 nm. This diffusion is then completed by the final annealing of the bipolar structure. A P-type implant is then performed through oxide 31 to form an intrinsic base region 33 at the center of the opening in layers 23 and 24. This intrinsic base is preferably implanted with low energy boron (for example, $10^{13}$at./cm$^2$ under 5 keV). The contact with polysilicon 23 results from the lateral diffusion of the boron of the polysilicon.

A uniform deposition of a thin silicon nitride layer (30 nm) coated with a polysilicon layer (100 nm) is then performed. The polysilicon layer is then etched anisotropically so that there only remains spacers 43 on the sides of the opening made in layers 23 and 24. Then, a uniform etching of the silicon nitride is performed, so that the silicon nitride remains in place only in the regions 44 where it is protected from the etching (chemical or plasma etching) by polysilicon spacers 43. Nitride 44 and spacers 43 altogether thus define a smaller opening than the opening initially formed in layers 23 and 24 for the definition of the intrinsic base. This smaller opening is the emitter opening. If the spacers have a width of around 150 nm each, this small opening has a width of around 0.5 µm.

Figure 8:
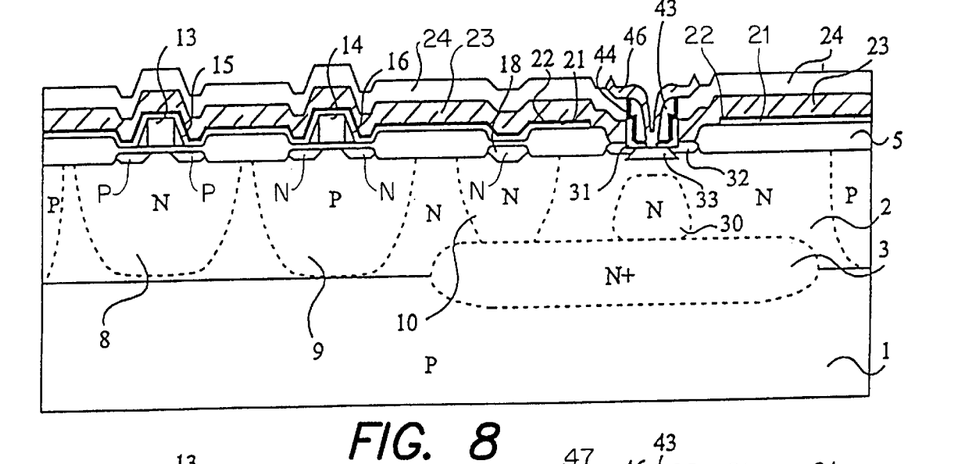

At the step illustrated in FIG. 8, the thin oxide layer 31 at the bottom of the opening, which had been used as a protective layer during the emitter implant (boron) and as an etching stop for the silicon nitride layer, is carefully cleaned, for example in a bath of diluted fluorhidric acid. A highly-doped N-type polysilicon layer is deposited, and then etched to leave in place a region 46. Regions of the doped polysilicon layer 46 can be maintained in place in selected locations to form, for example, capacitors between regions of this polysilicon 46 and regions of base polysilicon 23.

Figure 9:
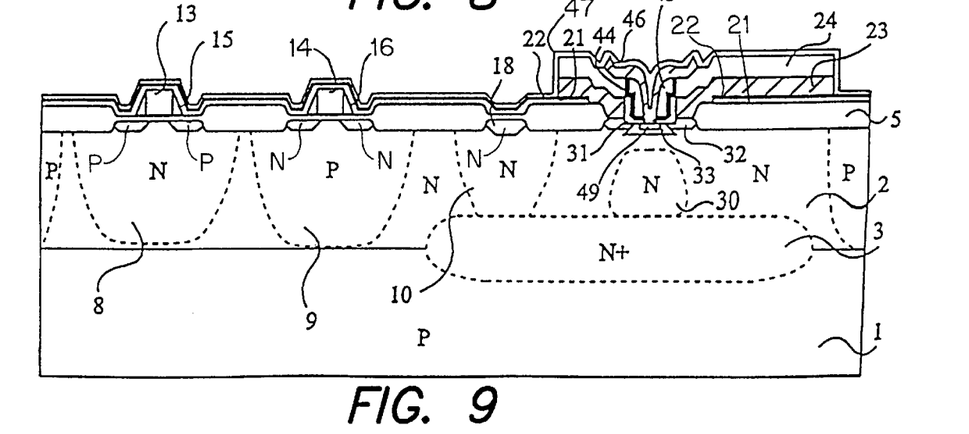

At the step illustrated in FIG. 9, the oxide and base polysilicon layers 24 and 23 are removed outside the emitter-base region of the bipolar transistor and other possible regions including devices using portions of base polysilicon layer 23 (resistors, capacitors . . . ). Then, an encapsulation silicon oxide layer 47 is deposited.

Afterwards, an annealing is performed to have the dopant contained in polysilicon layer 46 penetrate into the center of the base region of the transistor to form its N-type emitter 49. The annealings associated with the bipolar transistor ensure an electric reactivation of the dopings and lead to junction depths of about 60 nm. The annealings are of the fast thermal annealing type and/or furnace annealing type. The thermal processing (30 s, 1000° C.) is lighter than for the MOS transistors which are thus not affected.

Figure 10:
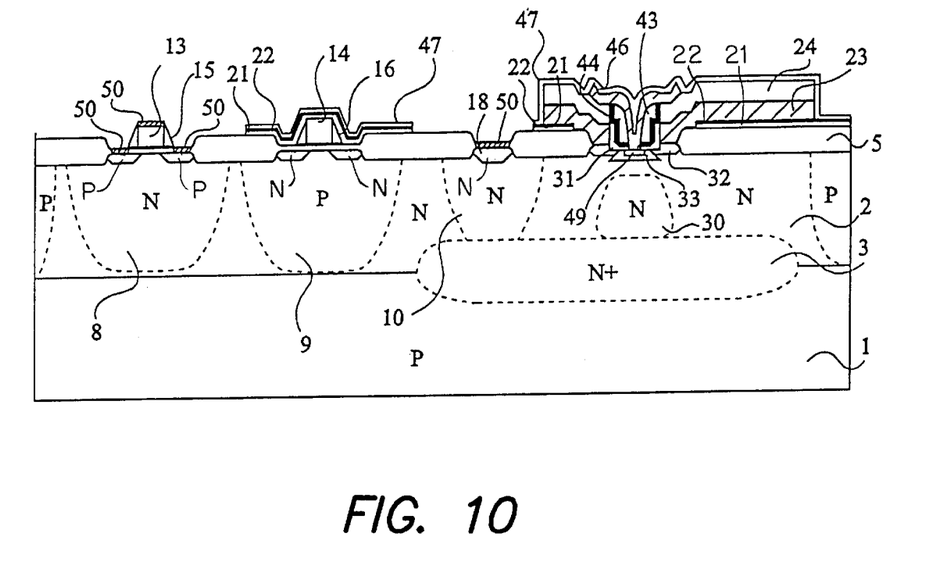

At the step illustrated in FIG. 10, the encapsulation silicon oxide, silicon nitride, and protection silicon oxide layers 47, 22, and 21 are removed above the active and/or polysilicon layers which are desired to be silicided, for example the P-channel MOS transistor and the collector well of the bipolar transistor. A metal silicide 50 is formed selectively above the exposed monosilicon and polysilicon layers.

Figure 11:
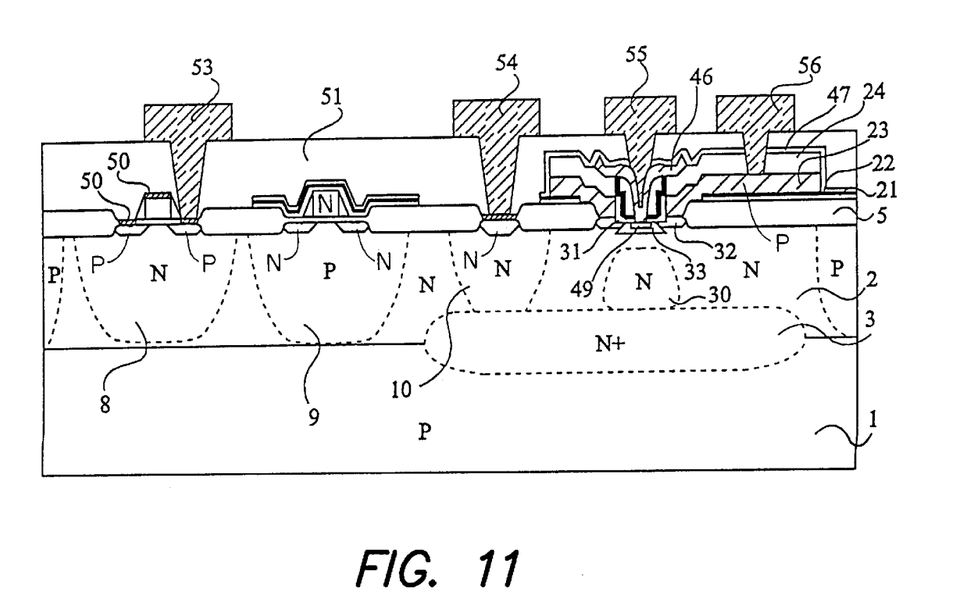

At the step illustrated in FIG. 11, an insulating planarization layer 51 is deposited by any known method, for example, by deposition of a boron and phosphorus-doped glass layer (BPSG) and is annealed, then this layer and possible underlying layers are opened at the locations where contacts are desired to be made. Only some contacts have been shown since, as it is well known, the contacts are not necessarily made directly above the effective areas but possibly on crosswise extensions of conductive regions extending from these effective areas. Thus, in FIG. 11, only one drain contact 53 of a P-channel MOS transistor, one collector contact 54, one emitter contact 55 and one base contact 56 of the bipolar transistor have been shown.

Figure 12:
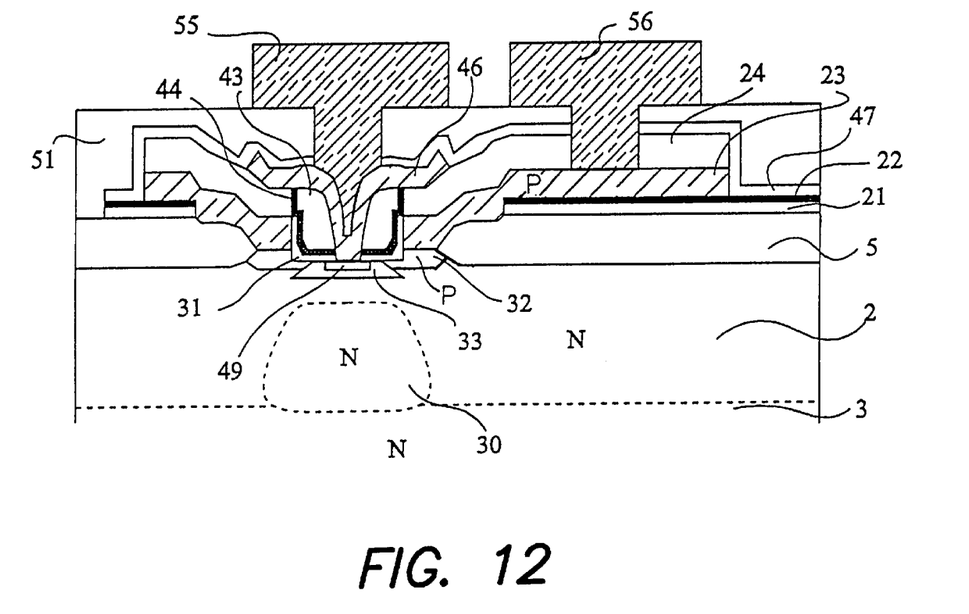
FIG. 12 is an enlarged view of an NPN-type bipolar transistor obtained by the method illustrated in FIGS. 1 to 11.

FIG. 12 corresponds to the bipolar side of FIG. 11 and shows the emitter-base region of the bipolar transistor at a larger scale.

In a specific embodiment, and to give an example of orders of magnitude, it may be chosen to implement a structure with the following numeric data (where e designates a width, and Cs a superficial concentration or a mean concentration for a homogeneous layer):

| | |
|---|---|
| substrate 1: | $Cs = 10^{15}$ at./cm$^3$, |
| epi layer 2: | $Cs = 10^{16}$ at./cm$^3$, e = 0.8 to 1.4 $\mu$m, |
| buried layer 3: | $Cs = 10^{20}$ at./cm$^3$, |
| oxide 5: | e = 0.5 $\mu$m, |
| N or P sources and drains: | $Cs = 10^{20}$ at./cm$^3$, e = 0.15 $\mu$m. |

The fabrication process described hereabove, while being perfectly compatible with existing lines of fabrication of high definition CMOS transistors, enables implementation of a bipolar transistor, the collector, intrinsic base, and emitter regions of which are self-aligned.

This bipolar transistor has many advantages. Its performance does not suffer from the presence of the CMOS transistors. It can, in particular, be used at radio frequencies (cut-off frequency higher than 40 GHz). The very high transconductance and the low noise of the bipolar transistor make it useful in analog applications. In particular, the base contact (in P$^+$ polysilicon) enables an advantageous and large reduction of the base resistance, which results in an advantageous improvement in RF noise factor. Thus, the bipolar transistor can be used instead of some AsGa transistors with a lower cost and the possibility of associating this transistor on the same chip with a high-performance CMOS circuit.

The present invention aims at a variant of the above-described method for further improving the performances of the bipolar transistor.

Figure 13:
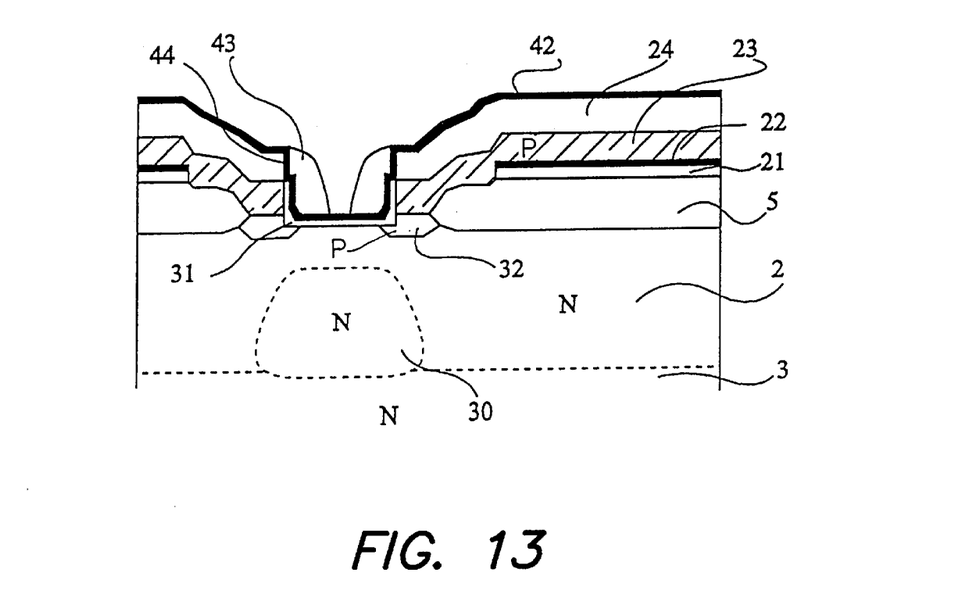
FIGS. 13 to 17 show steps of fabrication of an alternative bipolar transistor of NPN type according to the present invention.

FIG. 13 shows the structure of this bipolar transistor previously described at an intermediary step between those illustrated in FIGS. 6 and 7, that is, where spacers 43 have been formed but silicon nitride layer 42, a portion 44 of which is enclosed by spacers 43, has not been etched yet.

A structure in which the polysilicon spacers 43 have a width (a lateral extension) at the foot of the opening of about 200 nm and the thickness of the silicon nitride layer 42 is about 50 nm, that is, thicker as what has been described in the preceding embodiment, will have been chosen.

In the following step, illustrated in FIG. 14, as previously, silicon nitride layer 42 is etched. However, this etching is now necessarily performed isotropically (for example, a chemical H$_3$PO$_4$ etching) and is continued so that the silicon nitride is etched to create a recess under the spacer legs. A hollow area 101 having, for example, an extension of 100 nm at the bottom of the internal circumference of the opening is thus formed.

Figure 14:
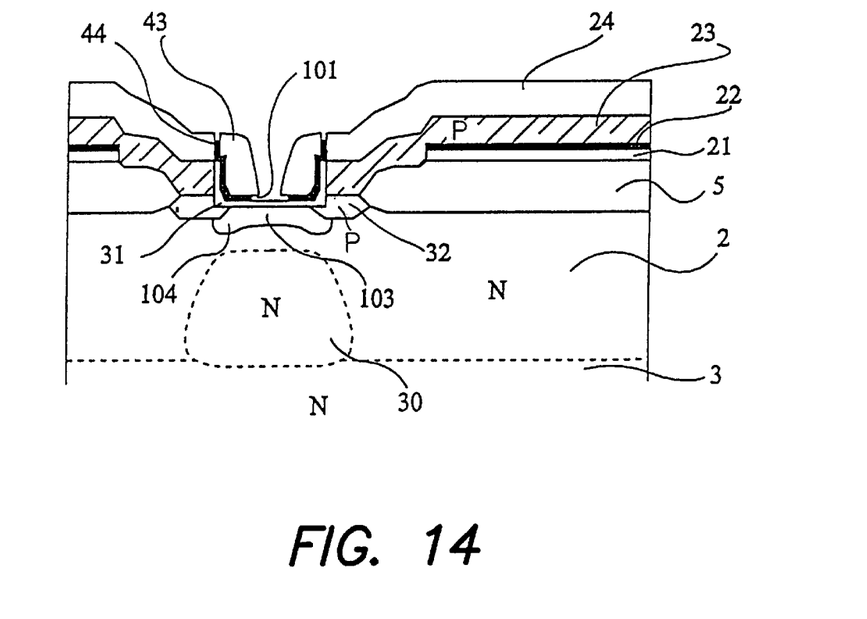

Still at the step illustrated in FIG. 14, a base implant is performed. This implant is preferably performed in two steps. On the one hand, a vertical implant, on the other hand, an implant under oblique incidence at a maximum angle compatible with the shape of the spacers. A base region including a shallower central portion 103 and a lateral portion 104 extending to join base contact region 32 is thus obtained.

Figure 15:
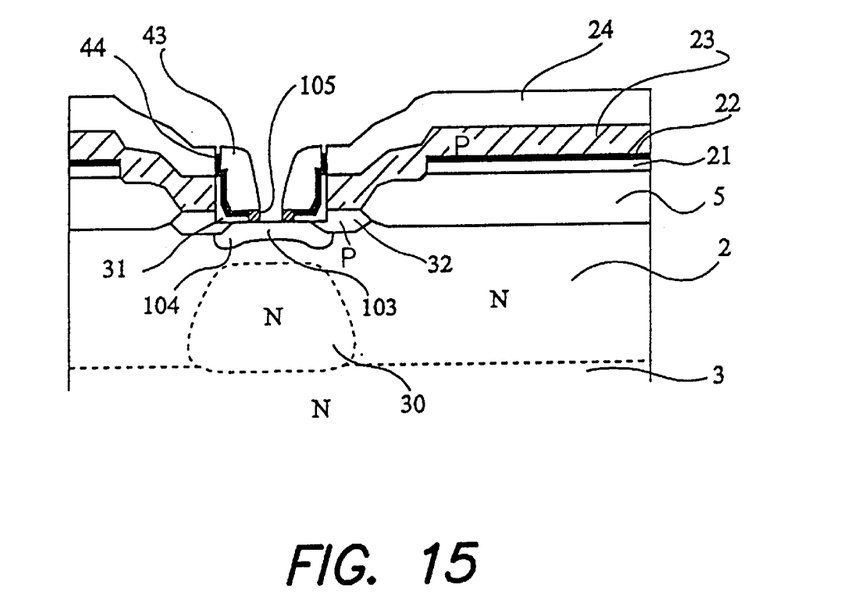

At the step illustrated in FIG. 15, the thin thermal oxide layer 31 is etched where it has been uncovered by the removal of the nitride layer, after which an in situ highly-doped N-type polysilicon layer, for example of some 10$^{20}$ atoms/cm$^3$, having, for example, a thickness of 5 nm, is deposited, after which this layer undergoes a vertical anisotrope etching. There thus remains in place in hollow areas 101 portions 105 of this N-type doped polysilicon layer. A portion of this polysilicon layer (not shown) also remains in place on the side of the spacers and will help reduce the resistance of access to the emitter.

Figure 16:
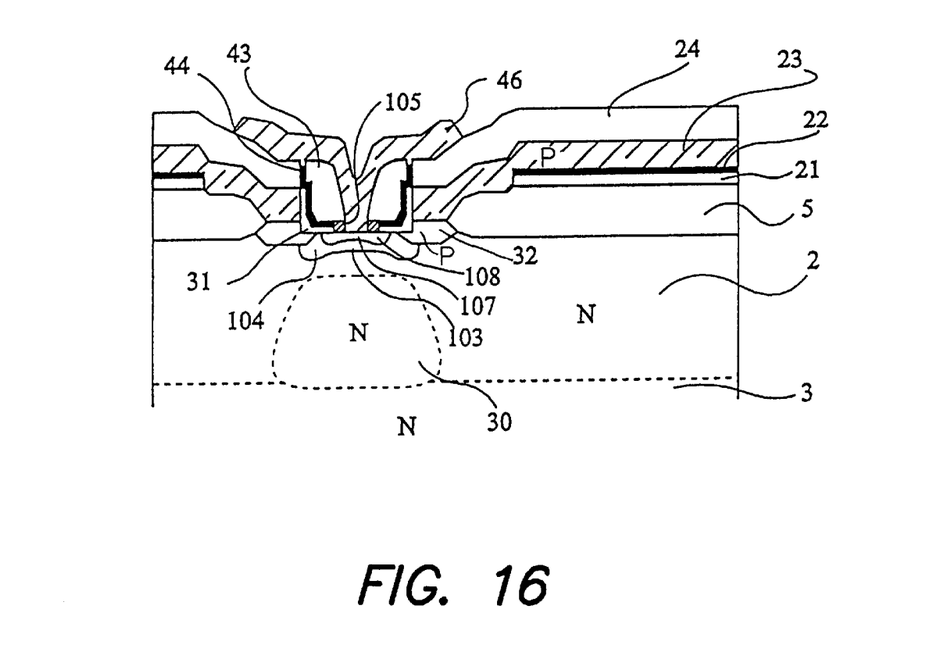

Once this step has been performed, the previously described steps, illustrated from FIG. 8 on, are repeated. As shown in FIG. 16, polysilicon layer 46 previously described is deposited and etched. In the present variant, this polysilicon layer 46 is less doped than polysilicon 105, for example 10 to 100 times less doped.

Thus, after diffusion, an emitter area having the shape shown, that is, having a more lightly-doped central portion 107 in contact with the emitter contact polysilicon 46 and a more highly-doped area 108 under regions 105, is obtained.

After this, the fabrication steps continue as described previously.

Such an inhomogeneously-doped emitter structure has several advantages. Especially, the fact that the doping of the polysilicon layer ensuring the conduction to the contact is the lowest possible enables avoiding recombination of minority holes coming from the base. Conversely, due to the higher level of doping of the emitter circumference, the injection efficiency is increased. Thus, a structure of this type enables increasing the injected current and decreasing the base parasitic current, while maintaining the advantages inherent to the structure previously described in relation with FIGS. 1 to 12.

A possible disadvantage of the structure illustrated in FIG. 16 is that, concurrently to the lateral etching of silicon nitride layer 42 in the lower area, this layer has been etched vertically at the interface between spacer 43 and silicon oxide layer 24. The two polysilicon layers 23 and 46 are then close to each other in this area which can be disturbed by several etching operations and there is a risk of short-circuit between the base polysilicon and the emitter polysilicon.

Figure 17:
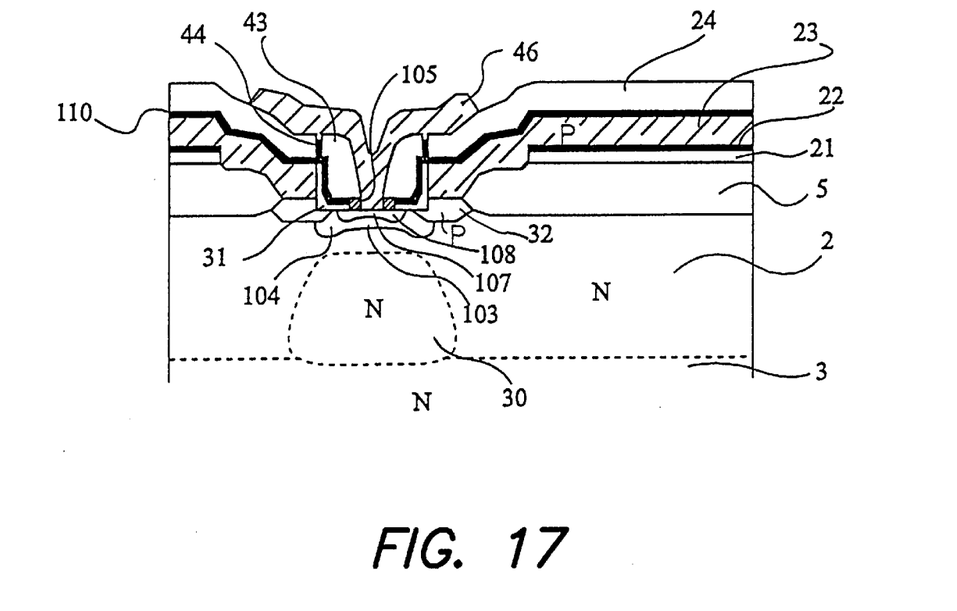

To avoid this disadvantage, the variant illustrated in FIG. 17 may be used. This drawing is identical to FIG. 16, except that a silicon nitride layer 110 has been formed at the interface of silicon oxide layer 24 and polysilicon layer 23. This has the advantage that upon deposition of silicon nitride 42, this silicon nitride layer 42 will tend to weld with the adjacent edge of silicon nitride layer 110. The risk of a possible short-circuit between polysilicon layers 23 and 46 is thus considerably reduced.

Those skilled in the art will note that other components can be devised while using the line according to the present invention and that this line is likely to have several alterations, modifications, and improvements. In particular, the indicated numeric values have been indicated as an example only and each material indicated as an example can be replaced with another material having the same function (for example, etching selectivity with respect to other materials). Further, various primary components can be implemented with or without a buried layer of one or the other type of conductivity.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for fabricating an integrated circuit including a bipolar transistor of NPN type, including the following steps:

forming an N-type epitaxial layer on a P-type substrate, a buried layer being provided at least at a location of a bipolar transistor;

forming a thick oxide layer having an opening at a base-emitter region of the bipolar transistor;

forming a first P-type doped polysilicon or amorphous silicon layer and a second oxide layer;

forming an opening in the doped polysilicon layer or the silicon layer and the oxide layer at a center of the base-emitter region of the bipolar transistor;

diffusing dopants contained in the first silicon layer in the epitaxial layer, to form an extrinsic base of the bipolar transistor, wherein during said diffusion a thin oxide layer forms on exposed silicon surfaces;

depositing a layer of silicon nitride and a second layer of polysilicon over the opening, and anisotropically etching the second layer of polysilicon to form spacers at vertical sides of the opening;

removing exposed parts of said silicon nitride and overetching said silicone nitrade under the spacers;

removing the thin oxide layer at locations where the silicon nitride has been overetched;

forming an N-type collector region by implantation;

implanting a P-type dopant to form an intrinsic base region of the bipolar transistor;

depositing a third highly-doped N-type polysilicon layer into the opening and anisotropically etching to leave a part of the third polysilicon layer where the silicon nitride has been overetched; and depositing a fourth N-type doped polysilicon layer over the opening and diffusing dopants contained in the third and fourth layers to form an emitter region of the bipolar transistor.

2. A method according to claim 1, wherein the first silicon nitride layer has a thickness of around 50 nm.

3. A method according to claim 1, wherein the spacers have a base length of around 200 nm and the overetching removes the silicon nitride layer across a width of around 100 nm.

4. A method according to claim 1, wherein the third polysilicon layer is doped to about $10^{20}$ at./cm$^3$ and is from 10 to 100 times more doped than the fourth polysilicon layer.

5. A method according to claim 1, including the step of depositing a second silicon nitride layer between the first P-type doped polysilicon or amorphous silicon layer and the second encapsulation oxide layer.

6. A method according to claim 1 Wherein the epitaxial layer has a thickness in a range of 1 to 1.2 µm.

7. A method according to claim 1 wherein said buried layer is of the N-type.

8. A method according to claim 1 wherein the integrated circuit includes a MOS transistor and said method including said MOS transistors.

9. A method according to claim 1 wherein the thick oxide layer is formed with at least one thin oxide region.

10. A method according to claim 9 including implanting N-type wells and P-type wells in the epitaxial layer under respective thin oxide regions.

11. A method according to claim 10 including forming a collector well of N-type in the epitaxial layer.

12. A method according to claim 11 including forming insulated gates of the MOS transistors.

13. A method according to claim 12 including inking source and drain implants of the N-channels transistors in the P wells, and performing a highly-doped N-type diffusion at the surface or well.

14. A method according to claim 1 including providing a protection layer including a silicon oxide layer followed by a silicon nitride layer, both deposited over the entire structure.

15. A method according to claim 14 wherein the silicon oxide layer is deposited to a thickness of about 20 nm and said silicon nitride layer is deposited to a thickness of about 30 nm.

16. A method according to claim 1 including implanting a P-type doping in the first polysilicon layer by implanting boron at a very high dose low energy $BF_2$($10^{15}$ to $10^{16}$ at./cm$^2$).

17. A method according to claim 1 wherein the N-type collector doping is performed at medium dose and high energy on the order of $10^{12}$ to $10^{14}$ at./cm$^2$ under 500 keV.

18. A method according to clam 1 wherein the implanting for form the intrinsic base is with low energy boron on the order of $10^{13}$ at./cm$^2$ under 5 keV.

19. A method of fabricating an integrated circuit including a bipolar transistor, said method comprising the steps of:

forming an epitaxial layer on a substrate;

forming a thick oxide layer with at least one thin oxide region over the epitaxial layer;

forming a first layer of one of a doped polysilicon and an amorphous silicon;

opening said first layer at a base-emitter region of the bipolar transistor;

diffusing a dopant contained in the first silicon layer into the underlying epitaxial layer to form an extrinsic base of the bipolar transistor;

depositing a first layer of silicon nitride and a second layer of polysilicon over the base-emitter region, and etching the second polysilicon layer to provide vertically disposed spacers at the base-emitter region;

removing exposed silicon nitride and overetching it under the spacers;

implanting a collector doping;

forming an intrinsic base of the bipolar transistor;

depositing into the base-emitter region a third polysilicon layer so that it penetrates into an overetched area under the spacers; and depositing into the base-emitter region a fourth polysilicon layer to form at least part of an emitter of the bipolar transistor.

20. A method according to claim 19 wherein the step of forming an epitaxial layer includes forming an N-type epitaxial layer on a P-type substrate.

21. A method according to claim 20 wherein the step of forming the thick oxide layer includes several said thin oxide regions for MOS transistors.

22. A method according to claim 21 wherein the epitaxial layer has a thickness in a range on the order of 1.0 to 1.2 µm.

23. A method according to claim 21 wherein the step of forming a first layer includes forming a P-type doped polysilicon.

24. A method according to claim 23 including forming a second encapsulation oxide layer.

25. A method according to claim 24 wherein both said first layer and said second encapsulation oxide layer are opened at the center of the base-emitter region of the bipolar transistor.

26. A method according to claim 25 including, during the diffusing step, forming a thin oxide layer on the apparent silicon surfaces.

27. A method according to claim 19 wherein the etching of the second polysilicon layer is by anisotropic etching.

28. A method according to claim 27 wherein the step of implanting a collector doping includes implanting an N-type collector doping.

29. A method according to claim 28 wherein the step of forming the intrinsic base includes implanting a P-type doping.

30. A method according to claim 29 wherein the step of depositing a third polysilicon layer includes depositing a third highly-doped N-type polysilicon layer.

31. A method according to claim 30 wherein the third highly-doped N-type polysilicon layer is etched anistropically to leave it in place in the overetched area.

32. A method according to claim 31 wherein the step of depositing a fourth polysilicon layer includes depositing a fourth N-type doped polysilicon layer and diffusing the doping contained in the third and fourth layers to form the emitter.

33. A method according to claim 19 wherein the step of depositing the first layer of silicon nitride includes depositing the layer to a thickness around 50 nm.

34. A method according to claim 19 wherein the step of providing the spacers includes providing the spacers with a base length around 200 nm, and the overetching of the silicon nitride layer is performed across a width of around 100 nm.

35. A method according to claim 19 wherein the third polysilicon layer is doped to about $10^{20}$ at./cm$^3$ and is from 10 to 100 times as doped as the fourth polysilicon layer.

36. A method according to claim 19 including forming a second encapsulation oxide layer.

37. A method according to claim 36 including the step of depositing a second silicon nitride layer between the first polysilicon layer or amorphous silicon layer and the second encapsulation oxide layer.

38. A method according to claim 19 including, after the step of removing the apparent silicon nitride, the step of removing the thin oxide layer at the locations where the apparent silicon nitride has been overetched.

* * * * *